United States Patent
Brown et al.

(10) Patent No.: US 8,854,217 B2
(45) Date of Patent: Oct. 7, 2014

(54) METHOD AND APPARATUS FOR OPERATING AN ELECTRICITY METER

(71) Applicant: Sensus USA Inc., Raleigh, NC (US)

(72) Inventors: Michael R. Brown, Mandeville, LA (US); William R. Mazza, Jr., Harrison City, PA (US); Andrew James Bryce Dudding, Cary, NC (US)

(73) Assignee: Sensus Spectrum LLC, Raleigh, NC (US)

( * ) Notice: Subject to any disclaimer, the term of this patent is extended or adjusted under 35 U.S.C. 154(b) by 29 days.

(21) Appl. No.: 13/765,732

(22) Filed: Feb. 13, 2013

(65) Prior Publication Data

US 2014/0225737 A1 Aug. 14, 2014

(51) Int. Cl.
*G08B 17/00* (2006.01)

(52) U.S. Cl.
USPC .................. 340/588; 340/589; 340/584

(58) Field of Classification Search
USPC .......................................... 340/588
See application file for complete search history.

(56) References Cited

U.S. PATENT DOCUMENTS

| | | | | |
|---|---|---|---|---|
| 7,513,683 | B2 * | 4/2009 | Sanderford et al. | 374/102 |
| 2002/0105435 | A1 * | 8/2002 | Yee et al. | 340/870.07 |
| 2010/0036625 | A1 * | 2/2010 | Martin et al. | 702/62 |
| 2010/0127880 | A1 * | 5/2010 | Schechter et al. | 340/584 |

FOREIGN PATENT DOCUMENTS

| | | |
|---|---|---|
| WO | WO 2010/067299 A2 | 6/2010 |
| WO | WO 2013/006901 A1 | 1/2013 |
| WO | WO 2013006901 A1 * | 1/2013 |

OTHER PUBLICATIONS

Combined International Search Report and Written Opinion with Search History issued Feb. 26, 2014 in PCT/US2013/060088.

* cited by examiner

*Primary Examiner* — Travis Hunnings
(74) *Attorney, Agent, or Firm* — Oblon, Spivak, McClelland, Maier & Neustadt, L.L.P.

(57) ABSTRACT

A method and apparatus that monitors and controls the operation of an electricity meter, and modifies at least one temperature threshold for determining when an alarm message should be transmitted or an electrical connection in the meter should be disconnected. The method and apparatus includes a plurality of sensors that detect temperatures in various locations within the electricity meter. The method and apparatus compares at least one detected temperature to at least one threshold, and operates an alarm or a switch when the detected temperature exceeds the threshold. The method and apparatus determines an average rate of change for at least one temperature according to a short-term temperature average over a first number of samples of the temperature, and a long term-term temperature average over a second number of samples of the temperature. The second number of samples is different from the first number of samples. The method and apparatus reduces the threshold when the average rate of change exceeds a predetermined amount.

29 Claims, 8 Drawing Sheets

METHOD AND APPARATUS FOR OPERATING AN ELECTRICITY METER

FIELD

The present invention relates to a method and apparatus that monitors a rate of change in temperature and a temperature difference between different locations within an electricity meter, and adjusts alarm and disconnection thresholds accordingly to improve the responsiveness of the electricity meter to potential high temperature conditions.

BACKGROUND

Conventional electricity meters include an electrical connection between a power source and a load. Conventional electricity meters detect the temperature inside a meter, and may send alerts and disconnect the power source from the load when a detected temperature reaches set predetermined thresholds.

SUMMARY

One object of the method and apparatus described herein is to monitor the operation of an electricity meter and implement measures in advance of the occurrences of various operating conditions.

A further object of the method and the apparatus is to modify operational thresholds for sending an alarm or disconnecting an electrical connection, in response to current operating conditions that indicate the operational thresholds may be exceeded.

Another object of the method and apparatus is to send an alarm or disconnect an electrical connection at lower thresholds in order to respond earlier to operating conditions that if prolonged, may risk the continued operation of the meter.

BRIEF DESCRIPTION OF THE DRAWINGS

A more complete appreciation of aspects of this disclosure and many of the attendant advantages thereof will be readily obtained by reference to the following detailed description when considered in connection with the accompanying drawings, wherein.

DETAILED DESCRIPTION

Figure 1A:
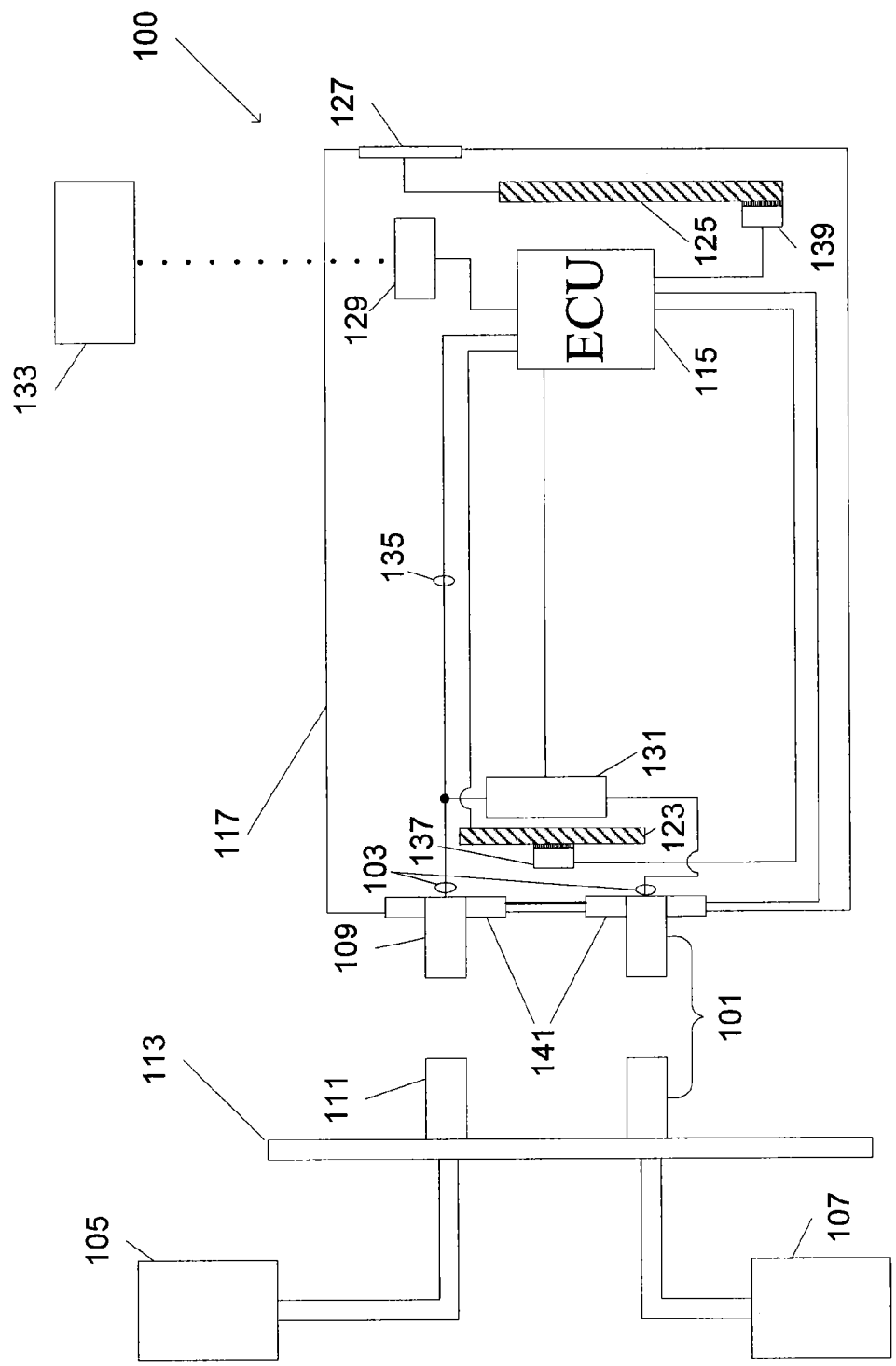
FIGS. 1A and 1B each provide a block diagram for a system including an apparatus for monitoring and controlling the operation of a meter that includes an electrical connection between a power source and a load.

According to one aspect of the present disclosure, there is provided a system including a meter (electricity meter or other power measurement device), and a method for monitoring and controlling the operation of the meter, and modifying thresholds for sending an alarm or disconnecting an electrical connection in the meter. The method includes periodically detecting a first temperature of a first location with a first sensor and a second temperature of a second location with a second sensor. At least one of the first temperature and the second temperature are compared to a first threshold for transmitting an alarm and a second threshold for operating a remote disconnect switch. The first temperature is compared second temperature to determine a first temperature difference. A short-term temperature average of at least one of the first temperature and the second temperature is determined for a first number of samples, and a long-term temperature average is determine for a second number of samples of the temperature that was used for the short-term average. The method includes determining an average rate of change based on the short-term temperature average and the long-term temperature average. The method includes modifying at least one of the first threshold and the second threshold when the first temperature difference is equal to or greater than a third threshold and the average rate of change is equal to or greater than a fourth threshold.

According to another aspect of the present disclosure, there is provided a system including a meter (electricity meter or other power measurement device), and an apparatus for monitoring and controlling the operation of meter. The apparatus modifies thresholds for sending an alarm or disconnecting an electrical connection in the meter. The apparatus includes a first circuit, a second circuit, a remote disconnect switch, and a plurality of temperature sensors. The plurality of sensors include a first sensor proximate to the first circuit and detects a first temperature near the first circuit, and a second sensor proximate to the second circuit and detects a second temperature near the second circuit. The apparatus includes at least one processor configured to receive the first temperature from the first sensor and the second temperature from the second sensor, and compare at least one of the first temperature and the second temperature to a first threshold. The processor operates a remote disconnect switch or sends an alarm when the at least one of the first temperature and the second temperature exceeds the first threshold. The processor determines an average rate of change based on a short-term temperature average of at least one of the first temperature and the second temperature over a first number of samples, and a long-term temperature average of the at least one of the first temperature and the second temperature over a second number of samples. The processor modifies the threshold when a difference between the first temperature and second temperature is greater than a second threshold, and the average rate of change exceeds a third threshold.

It must be noted that, as used in the specification and the appended claims, the singular forms "a," "an," and "the" include plural referents unless the context clearly dictates otherwise.

Referring now to the drawings, wherein like reference numerals designate identical or corresponding parts throughout the several views. FIG. 1A is a block diagram of an electricity meter 100 including an electrical connection 101 in a line 103 that connects a power supply 105 to an electrical load 107. The electrical connection 101 is provided in the line 103 by the contact between contacts 109 of the electricity meter 100 and contacts 111 of a power panel 113. The contacts 111 of the power panel 113 provide a meter socket that receives the contacts 109 of the electricity meter 100. An enclosure 117 of the electricity meter 100 houses a controller 115 (ECU), a first IC 123, and a second IC 125.

The first IC 123 receives information from various sensors (not shown) and transmits the information from the various sensors to the controller 115. The controller 115 may operate the disconnect switch 131 to open based on the information transmitted from the first IC 123. The second IC 125 transmits and receives operational information from a user display 127 and the controller 115. The controller 115 transmits operational data to a communications board 129 that transmits information from the controller 115 to a back end 133. The back end 133 being part of a network (not shown) that communicates with multiple electricity meters 100.

The disconnect switch 131 is provided in an internal line 103 within the electricity meter 100. The disconnect switch 131 can be operated to disconnect the power supply 105 from the electrical load 107. In addition, the electricity meter 100 is provided with an auxiliary power connection 135, such that when the disconnect switch 131 is opened and the power supply 105 is disconnected from the electrical load 107, the electricity meter 100, and thus the controller 115, is still provided with power. The disconnect switch 131 can be operated remotely.

The electricity meter 100 is also provided with a first temperature sensor 137 located on the first IC 123 adjacent to the electrical connection 101. The first sensor 137 detects the temperature of at least one phase of the electrical connection 101. In a poly-phase meter, the first temperature sensor 137 transmits the highest temperature between the phases, or an average temperature for all of the phases, to the controller 115. The electricity meter 100 is also provided with a second temperature sensor 139 located on the second IC 125. The second temperature sensor 139 senses the temperature of the second IC 125 and transmits the temperature to the controller 115.

Figure 1B:
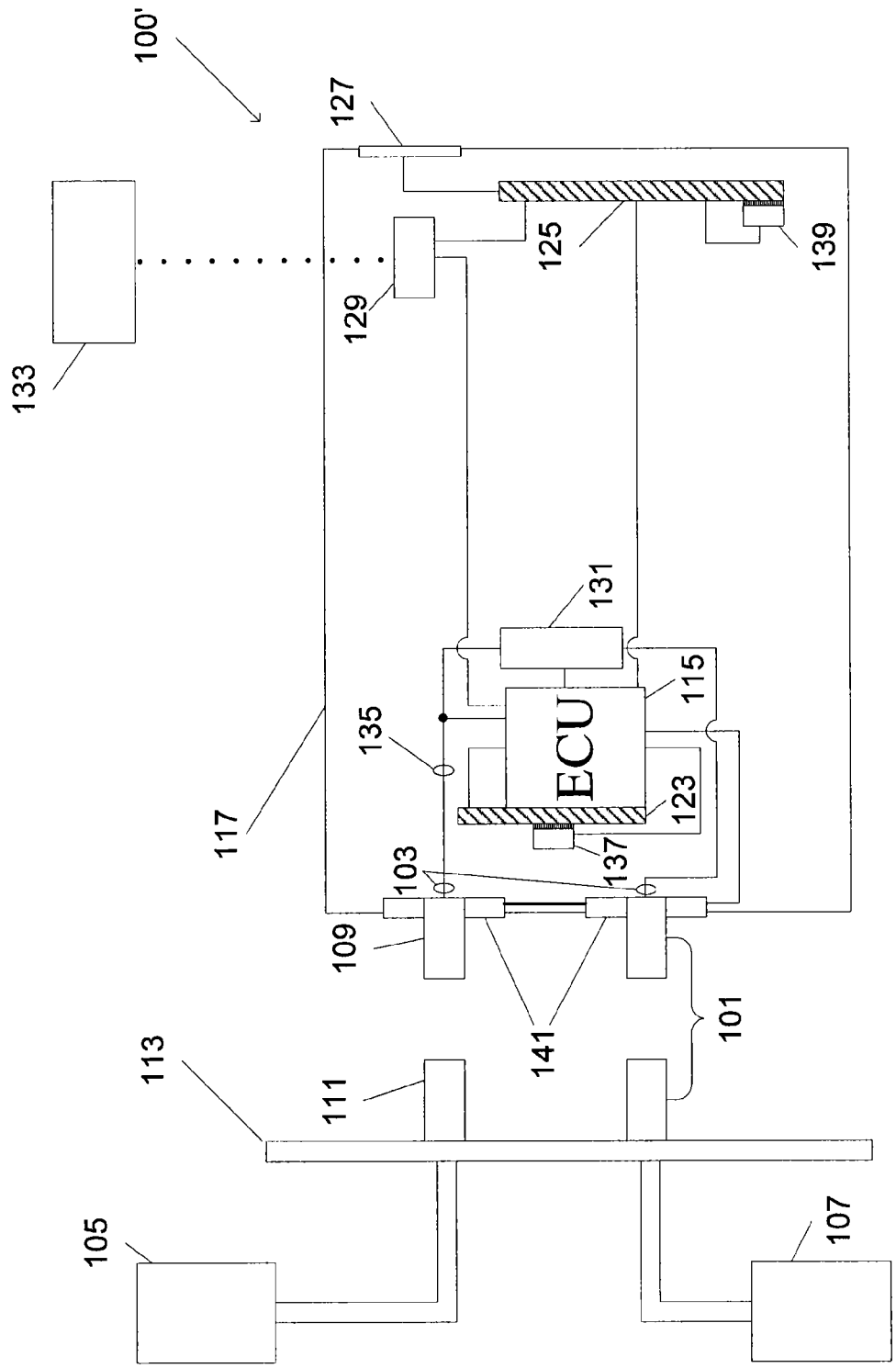

In the embodiment of an electricity meter 100' of FIG. 1B, the controller 115 is combined with the first IC 123, and the second temperature sensor 139 transmits temperature readings to the second IC 125. The second IC 125 is configured to receive the temperature reading from the second temperature sensor 139, transmit the reading to the controller 115, and send a high temperature alarm to the communications board 129 and the user display 127. The controller 115 receives temperature readings from the first temperature sensor 137 and the second IC 125, operates the disconnect switch 131, transmits the temperature detected by the first temperature sensor 137 to the second IC 125, and communicates with the communications board 129. The second IC 125 is configured to send the high temperature alarm message to the communications board 129 and the user display 127, when the temperature detected by the first temperature sensor 137, and transmitted by the controller 115, exceeds a threshold temperature.

The controller 115 in the embodiments of FIGS. 1A and 1B can send and receive information from the back end 133, including updated values for threshold values and look up tables used in the exemplary processes. The threshold values may be updated dynamically in response to the detection of certain operational parameters, or external conditions which may be determined by a user or a utility. In particular, the temperatures detected by the first and second temperature sensors (137, 139) may be used individually or together, to determine the degree to which threshold values for sending an alarm or disconnecting the electrical connection 101 are to be changed. One or more additional temperature sensors in different location within the meter may also be used for comparison with one or both of the temperatures detected by the first and second temperature sensors (137, 139).

Embodiments disclosed herein include temperature sensors provided on first and second ICs. In addition, separate stand alone temperature sensing units, including thermistors, thermocouples, or infra-red sensing devices may be mounted on interior portions of an enclosure, or to other components in an electricity meter. For example, one or more temperature sensors may be placed on or near a bus bar of an electrical connection.

Look up tables used to determine reference rates of change in temperature, can be updated dynamically in response to the detection of operating parameters of an electricity meter, or external conditions that may dictate different permissible rates at which temperature can change. The updates can be provided through a network communication or through onsite maintenance of the electricity meter 100.

A controller 115 may include one or more processors or equivalents thereof, such as a central processing unit (CPU) and/or at least one application specific processor (ASP). A processor may include one or more circuits or be a circuit that utilizes a computer readable medium, such as a memory circuit (e.g., ROM, EPROM, EEPROM, flash memory, static memory, DRAM, SDRAM, and their equivalents), configured to control the processor to perform and/or control the processes and systems of this disclosure. The processor can be a separate device or a single processing mechanism. Further, this disclosure can benefit from parallel processing capabilities of a multi-cored CPU.

Figure 2:
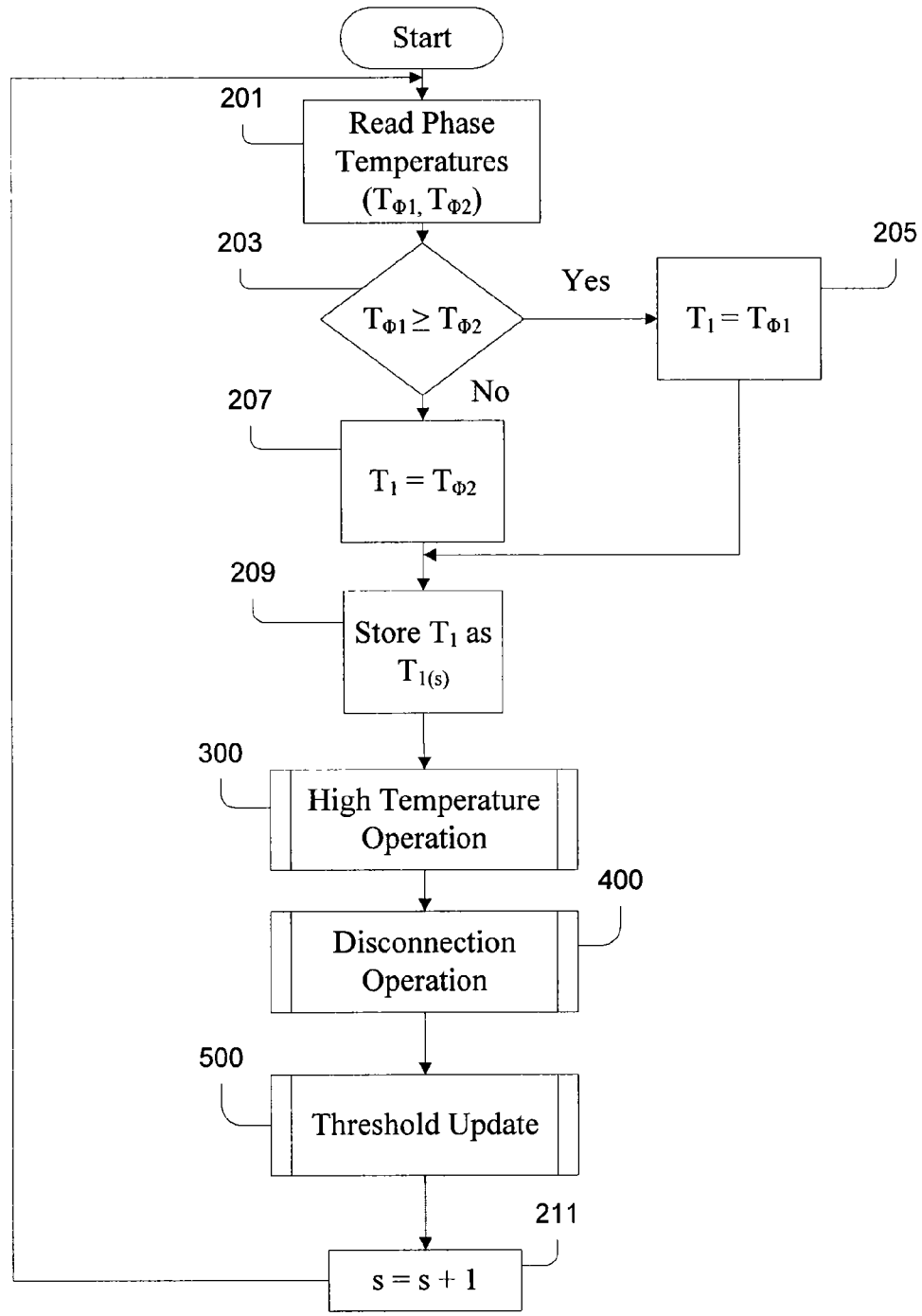
FIG. 2 is a flow chart illustrating an exemplary process for operating an electricity meter.

FIG. 2 is a flow chart illustrating an exemplary process for operating electricity meter according the embodiments of FIGS. 1A and 1B and for determining a first temperature in a first location, storing the first temperature separately for each iteration of the process, comparing the first temperature to high temperature alarm and meter disconnection thresholds, and updating those thresholds. In the alternative, a second temperature in a second location may be stored separately for each iteration and be compared to high temperature alarm and meter disconnection thresholds that are different from the thresholds which are compared to the first temperature of the first location.

As illustrated in FIG. 2, during a temperature detection step 201 for a poly-phase meter according to FIGS. 1A and 1B, the temperature of at least two phases of the electrical connection 101 are measured by the sensor 137 on the first IC 123. Once detected, a temperature ($T_{\phi 1}$) of a first phase, and a temperature ($T_{\phi 2}$) of a second phase are compared at step 203. A first temperature $T_1$ is set to the first phase temperature ($T_{\phi 1}$) at step 205 if the first phase temperature ($T_{\phi 1}$) is higher than the second phase temperature ($T_{\phi 2}$). The first temperature ($T_1$) is set to second phase temperature ($T_{\phi 2}$) at step 207 if the second phase temperature ($T_{\phi 2}$) is determined to be higher than the first phase temperature ($T_{\phi 1}$). In the alternative the first temperature can be an average of the first phase temperature ($T_{\phi 1}$) and the second phase temperature ($T_{\phi 2}$). The first temperature ($T_1$) is stored as ($T_{1(s)}$) in a memory unit of the controller 115 at step 209 for each incremented iteration (s) of the process of FIG. 2.

The process 200 illustrated in FIG. 2, is applied to a meter including multiple phases. The exemplary process 200 for operating an electricity meter may be applied to a single or poly-phase meter. In a meter with a single phase, the first temperature ($T_1$) is the temperature around the single phase of the electrical connection 101. In a poly-phase meter, the temperature at each phase may be detected. Further, the first temperature ($T_1$) can be set to the highest temperature detected of the individual phases, or an average of the individual temperatures for all the phases. In a two phase meter, the first phase or the second phase may be connected to phase A, B, or C of a three-phase connection.

In the exemplary process illustrated in FIG. 2 for operating an electricity meter, the first temperature ($T_1$) is referred to a process for sending an alarm for a high temperature condition.

Figure 3:
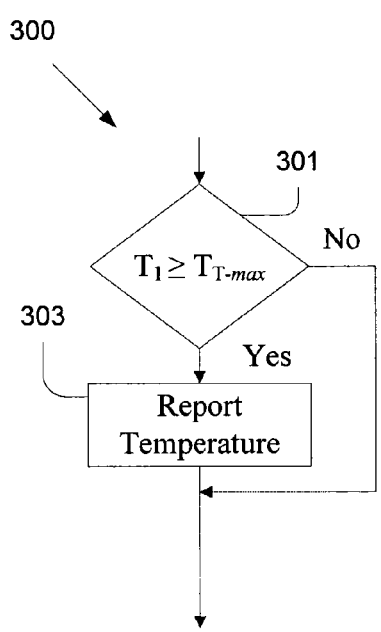
FIG. 3 is a flow chart illustrating an exemplary process for sending an alarm for a high temperature condition.

FIG. 3 is a flow chart illustrating a High Temperature Operation 300 for sending an alarm for a high temperature condition according to the present disclosure. The controller 115 of FIG. 1A or the second IC 125 in FIG. 1B, will determine if a high temperature alarm should be transmitted to the communications board 129 by comparing the first temperature ($T_1$) to a first threshold ($T_{T-max}$) for sending an alarm of a high temperature condition at step 301. When the first temperature ($T_1$) is greater than or equal to the first threshold ($T_{T-max}$), at least one temperature alarm message is transmitted to the communications board 129 at step 303. The at least one alarm message (or a number of messages, e.g. 6 messages) is sent to the communications board 129, which transmits the message to the back end 133 at step 303. When the first temperature ($T_1$) is not greater than or equal to the first threshold ($T_{T-max}$), no alarm message is sent.

In the exemplary process illustrated in FIG. 2 for operating an electricity meter, the first temperature ($T_1$) is referred to a process for disconnecting a meter (100, 100') after the High Temperature Operation 300.

Figure 4:
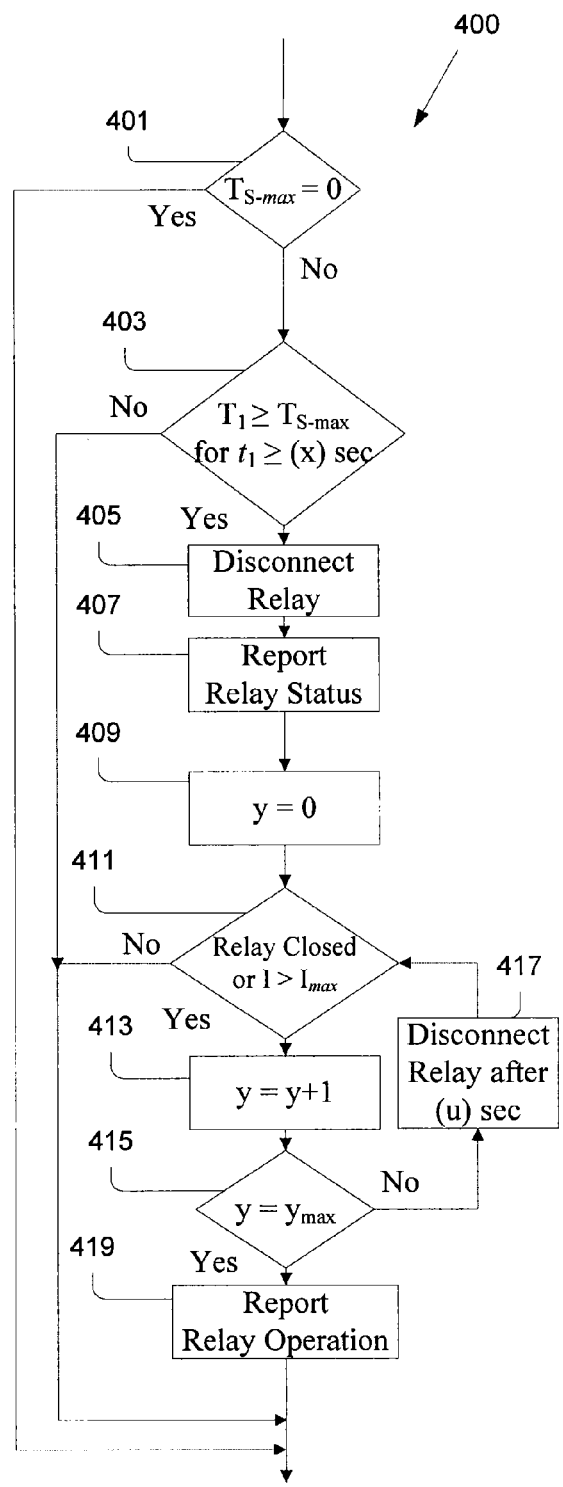
FIG. 4 is a flow chart illustrating an exemplary process for disconnecting an electricity meter.

FIG. 4 is a flow chart illustrating an exemplary process for the Disconnection Operation for disconnecting an electricity meter based on the first temperature ($T_1$). In the Disconnection Operation, disconnection switch 131 of the electricity meter 100 illustrated in FIG. 1, is operated to disconnect the electrical connection 101 based on the first temperature ($T_1$).

As noted above the first temperature ($T_1$) corresponds to the highest temperature between at least two phases of the electrical connection 101 (as noted above, in the alternative ($T_1$) could be the average of the temperatures of all of the phases). In the Disconnection Operation, it is determined whether a temperature based operation of the disconnect switch has been disabled at step 401. When a second threshold ($T_{S-max}$) is equal to zero, it is determined the temperature based operation of the disconnect switch has been disabled and the Disconnection Operation 400 is ended. The second threshold ($T_{S-max}$) corresponds to a second high temperature condition of the electrical connection 101, which can damage the meter (100, 100') if the load 105 is not disconnected from the power source 107.

When the second threshold ($T_{S-max}$) is not equal to zero, it is determined if the remote disconnect switch 131 must be opened to disconnect the electrical connection 101 by comparing the first temperature ($T_1$) to a second threshold ($T_{S-max}$) at step 403. The second threshold ($T_{S-max}$) corresponds to the second high temperature condition of the electrical connection 101, which can affect the normal operation of the meter (100, 100') if the load 105 is not disconnected from the power source 107. When the first temperature ($T_1$) is greater than or equal to the second threshold ($T_{S-max}$) for a period time ($t_1$) greater than or equal to a predetermined number (x) of seconds (e.g. 5 seconds), the disconnect switch 131 is operated to be opened at step 403. A Disconnect Switch Open Acknowledgement message is transmitted at step 407. At least one Disconnect Switch Open Acknowledgement message (or more, e.g. 6 messages) is sent to the communications board 129, which transmits the message to the back end 133 at step 407.

When the disconnect switch 131 is opened, a first counter (y) is reset to zero at step 409. As discussed below the first counter (y) is incremented to indicate a number of times the disconnect switch 131 has not opened correctly. A position of the disconnect switch 131 and a current sensor 141 are monitored, to determine if the electrical connection 101 has been properly disconnected at step 411. A measured current (I) is compared to a maximum allowable current ($I_{max}$) (e.g. 0.5 A) that can be present when the electrical connection 101 is disconnected.

When the position of the disconnect switch is closed or the measured current (I) is greater than the maximum allowable current ($I_{max}$), the first counter (y) is increased by 1 at step 413. It is determined whether the disconnect switch 131 failed to open a maximum number of times by comparing the first counter (y) to a maximum count ($y_{max}$) at step 415 (i.e. a maximum number of failed attempts to open the disconnect switch 131, such as one or six attempts). When the value of the counter (y) is less than the maximum count ($y_{max}$), a period of (u) seconds (e.g. 10 seconds) is allowed to elapse, and the disconnect switch 131 is operated at step 417, and step 411 is repeated. If the counter (y) has increased to ($y_{max}$), disconnect switch operation failure message is transmitted at step 419. When it is determined a position of the disconnect switch 131 is open or the measured current (I) is less than the maximum allowable current ($I_{max}$) at step 411, the first counter (y) is not increased and the disconnect switch operation failure message is not sent.

In the exemplary process illustrated in FIG. 2 for operating an electricity meter (100, 100'), the first temperature ($T_1$) is referred to a process for updating operational thresholds after the Disconnection Operation 400.

Figure 5:
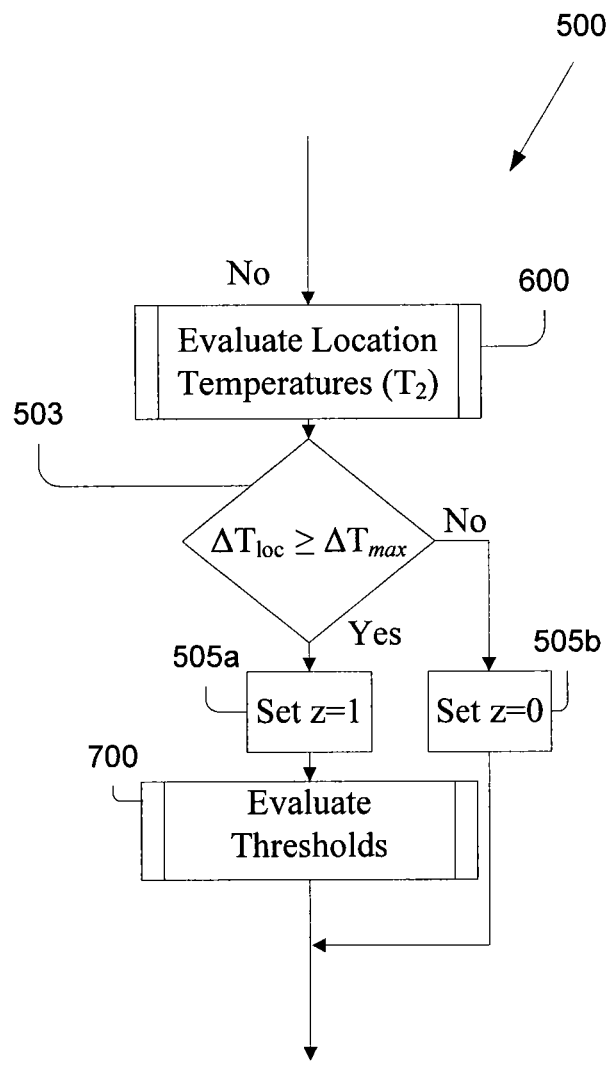
FIG. 5 is a flow chart illustrating an exemplary process for updating operational thresholds.

FIG. 5 is a flow chart illustrating an exemplary process for a Threshold Update 500 for updating operational thresholds. In the Threshold Update 500, the second temperature corresponding to the temperature of the second IC 125 is evaluated at process 600, Evaluate Location Temperatures ($T_2$).

Figure 6:
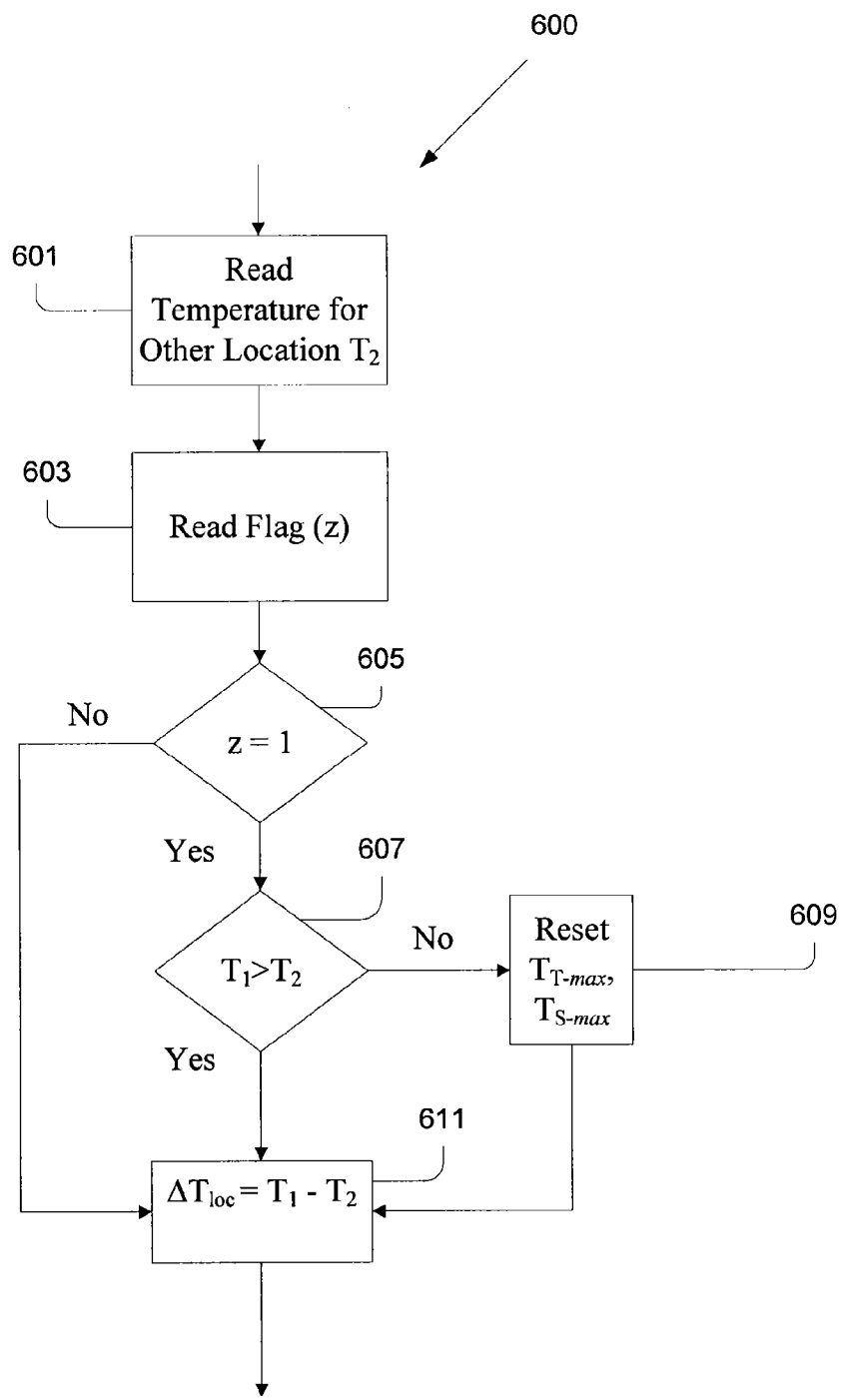
FIG. 6 is a flow chart illustrating an exemplary process for determining a temperature difference.

FIG. 6 is a flow chart illustrating an exemplary process to determine a first temperature difference according to the Evaluate Location Temperatures ($T_2$). The second sensor 139 is used to determine the second temperature ($T_2$) at step 601. As a result, second temperature ($T_2$) corresponds to a temperature in a second location of the meters (100, 100') illustrated in FIG. 1A and 1B. A flag (z) is read at step 603. When it is determined that the flag (z) is not equal 1, a third threshold ($\Delta T_{loc}$) for the first temperature difference between the first location where the first IC 123 is located, and the second location where the second IC 125 is located, is determined in step 611 from $T_1$-$T_2$. The value of flag (z) not being equal to 1, indicates the first threshold ($T_{T-max}$) and the second threshold ($T_{S-max}$) are not modified from respective original values.

When it is determined the flag (z) is equal to 1, the first temperature $T_1$ is compared to the second $T_2$ at step 607. The value of flag (z) being equal to 1, indicates the first threshold $T_{T-max}$ and the second threshold $T_{S-max}$ have been modified from respective original values (as with a previous iteration of the Threshold Update 500). When it is determined that $T_1$ has decreased from a previous level that required a change in thresholds, to less than the second temperature $T_2$, the first threshold ($T_{T-max}$) and the second threshold ($T_{S-max}$) are reset to respective original values in step 609. The first temperature difference ($\Delta T_{loc}$) between the first location where the first IC 123 is located, and the second location where the second IC 125 is located, is determined as $T_1$-$T_2$ in step 611 after step 609.

In the exemplary process illustrated in FIG. 5 for updating operational thresholds with the Threshold Update 500 process, the first temperature difference ($\Delta T_{loc}$) determined in the Evaluate Location Temperatures 600 process is compared to a maximum temperature difference ($\Delta T_{max}$) at step 503. If the first temperature difference ($\Delta T_{loc}$) is not greater than or equal to the maximum temperature difference ($\Delta T_{max}$), the flag (z) is set to equal zero in step 505b and the Threshold Update 500 process ends. However, if the first temperature difference ($\Delta T_{loc}$) is greater than or equal to the maximum temperature difference ($\Delta T_{max}$), the flag (z) is set equal to 1 in step 505a. This indicates there is a large difference in temperature between different locations within the meter, and the temperature of the electrical connection 101 may be increasing too rapidly. When the flag is set equal to 1, the first temperature ($T_1$) is referred to an Evaluate Thresholds 700 process.

Figure 7:
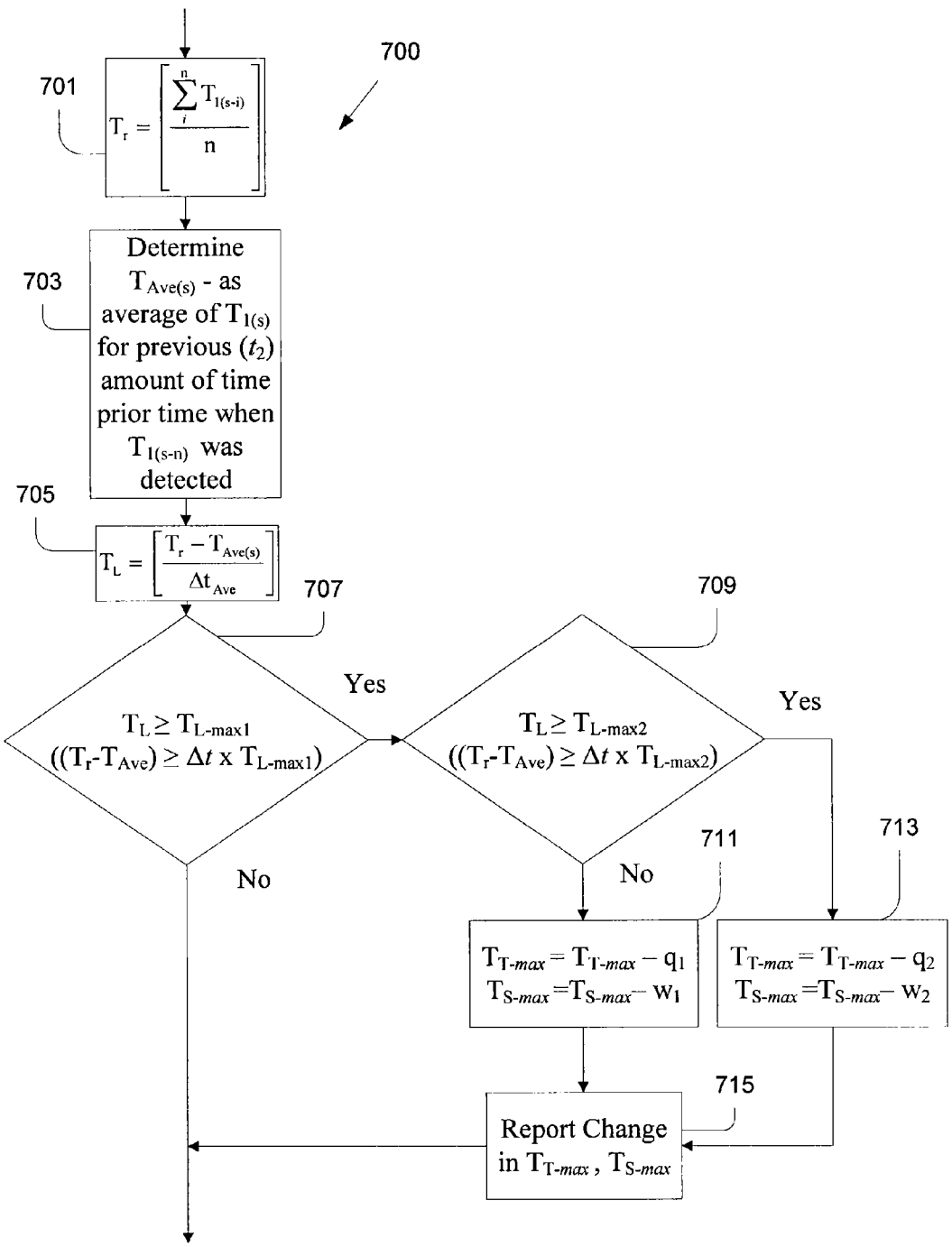
FIG. 7 is a flow chart illustrating an exemplary process for evaluating and updating temperature thresholds.

FIG. 7 is a flow chart illustrating an exemplary process for evaluating and updating temperature thresholds. In the Evaluate Thresholds 700 process, an average of the most recent (n) samples of ($T_1$) is determined as a short-term temperature average ($T_r$) in step 701. A long-term temperature average ($T_{Ave(s)}$) is calculated in step 703. The long-term temperature average ($T_{Ave(s)}$) corresponds to an average of all of the samples of $T_1$ over a time period ($t_2$) (e.g. 7 minutes). Preferably the number of samples in the long term temperature average is large. When a sufficient number of samples are used to determine the long-term temperature average ($T_{Ave(s)}$), the most recent samples of ($T_1$) will have a small influence on the long-term temperature average ($T_{Ave(s)}$). Thus it is not necessary to perform the step of filtering the most recent samples of ($T_1$) from a calculation of the long-term temperature average ($T_{Ave(s)}$). On the other hand when the number of samples used to determine the long-term temperature average ($T_{Ave(s)}$) is not large, it is preferable to exclude the most recent samples of ($T_1$), which may influence/change the long-term temperature ($T_{Ave(s)}$) a large amount. In this situation it is preferable to determine the long-term temperature average ($T_{Ave(s)}$) using samples of ($T_1$) occurring over the period of time ($t_2$), which is immediately before a first sample of the short-term temperature average ($T_r$).

An average rate of change ($T_L$) is calculated in step 705 as the difference of the short-term temperature average ($T_r$) and the long term temperature average ($T_{Ave(s)}$), divided by an average time change ($\Delta t_{Ave}$).

The average rate of change ($T_L$) is compared to a fourth threshold for a first maximum rate of change ($T_{L-max1}$) in step 707. The comparison may also be determined by comparing the first maximum rate of change ($T_{L-max1}$) multiplied by average time change ($\Delta t_{Ave}$) to the difference of the short-term temperature average ($T_r$) and the long-term temperature average ($T_{Ave(s)}$). When the average rate of change ($T_L$) is greater than or equal to the first maximum rate of change ($T_{L-max1}$), the average rate of change ($T_L$) is compared to a second maximum rate of change ($T_{L-max2}$) in step 709. When the average rate of change ($T_L$) is not greater than or equal to the second maximum rate of change ($T_{L-max2}$), the first threshold ($T_{T-max}$) for sending the high temperature alarm message and the second threshold ($T_{S-max}$) for operating the disconnect switch 131 are reduced by respective first ($q_1$) and second ($w_1$) values in step 711. A threshold change message is sent to the communications board 129 by the controller 115 at step 715. When the average rate of change ($T_L$) is greater than or equal to the second maximum rate of change ($T_{L-max2}$), the first threshold ($T_{T-max}$) and the second threshold ($T_{S-max}$) are reduced by respective third ($q_1$) and fourth ($w_1$) values in step 713. A threshold change message is sent to the communications board 129 at step 715. The third ($q_2$) and fourth ($w_2$) values are greater than the first ($q_1$) and second ($w_1$) values respectively.

Reducing the first threshold ($T_{T-max}$) for the sending the high temperature alarm message, and the second threshold ($T_{S-max}$) for operating the disconnect switch 131 is advantageous because a continual rise in temperature in the meter (100, 100') can be recognized before higher temperature thresholds that put continued proper operation at risk are reached.

The Threshold Update process 500 ends after it is determined the average rate of change ($T_L$) is not greater than or equal to the first maximum rate of change ($T_{L-max1}$), or the threshold hold change message is sent in step 715. As illustrated in FIG. 2, the counter (s) is incremented by 1 at step 211 once Threshold Update process 500 is complete.

Figure 8:
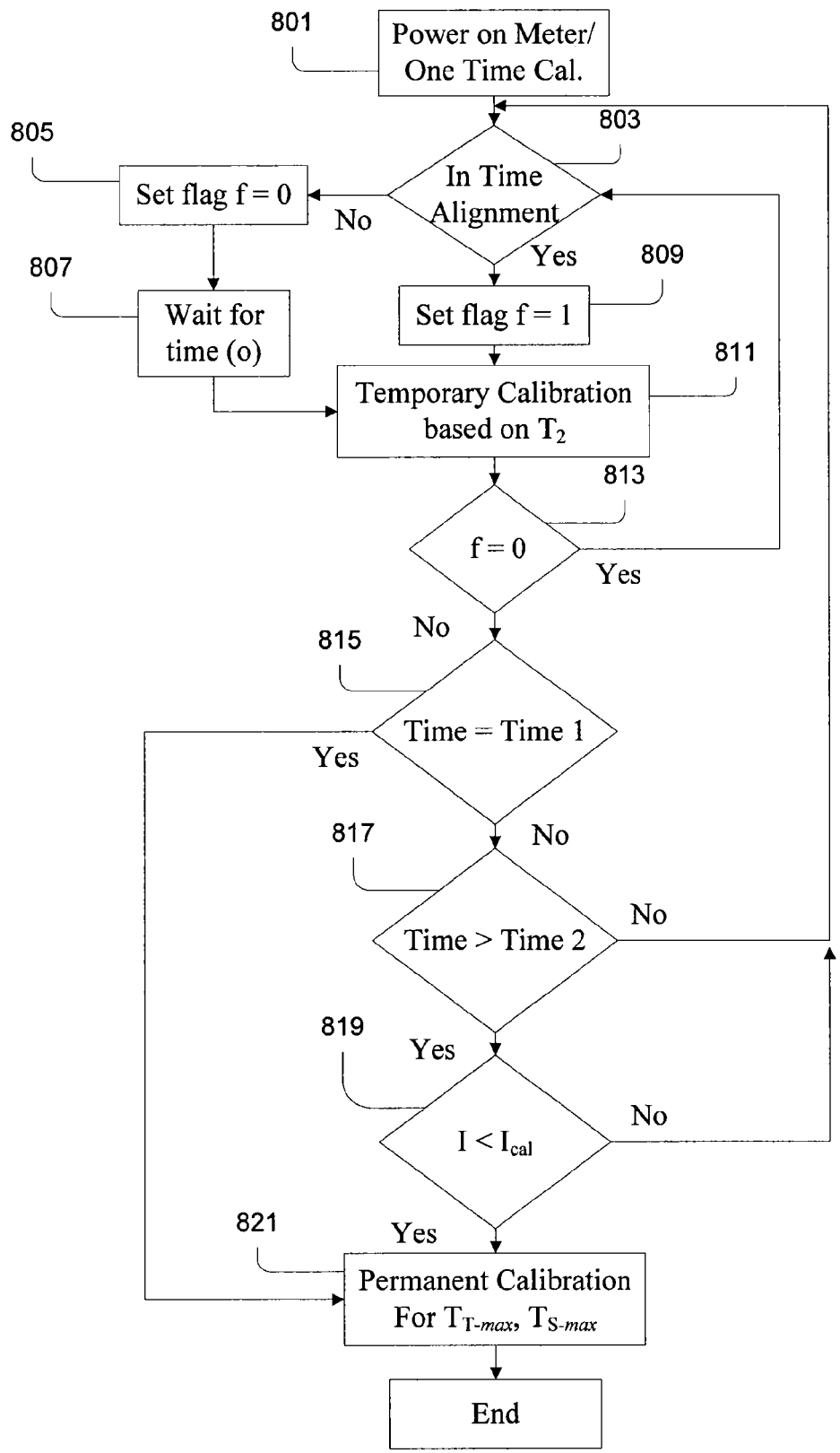
FIG. 8 is a flow chart illustrating an exemplary process for calibrating threshold values for an electricity meter.

FIG. 8 is a flow chart illustrating an exemplary process for calibrating threshold values for an electricity meter. An electrical meter is turned on at step 801 and a one time calibration of the second threshold ($T_{S-max}$), where the second threshold is set to a second temperature sensor 139 threshold for the second IC 125 at step 801. It is determined if the meter (100, 100') is in time alignment at step 803. If the meter (100, 100') is not in time alignment, a flag (f) is set to zero in step 805, and a period of time (o) is allowed to pass at step 807 (e.g. 24 hours—or comparable time period required for the meter to be in time alignment) before a temporary calibration occurs at step 811. If the meter (100, 100') is in time alignment, a flag (f) is set to 1 in step 809, and the temporary calibration occurs at step 811. The flag (f) is read at step 813, and if the flag (f) is equal to zero the time alignment of the meter (100, 100') is determined again at step 803.

If the value of the flag (f) is not equal to 0, it is determined if the current Time is equal to a Time 1 (e.g. 2:00 AM) at step 815. If the Time is equal to Time 1, at step 821 the first threshold ($T_{T-max}$) and the second threshold ($T_{S-max}$) are permanently calibrated. If the current Time is not equal to a Time 1 (e.g. 2:00 AM), it is determined if the current Time is later than a Time 2 (e.g. 1:00 AM) at step 817. When it is determined the current Time is not later that Time 2, it is determined if the meter (100, 100') is in time alignment at step 803 in a subsequent iteration of the calibration process 800 of FIG. 8. When the current Time is later than Time 2, the current (I) is compared to calibration current ($I_{cal}$) (e.g. 100 A) in step 819. When the current (I) is less than the calibration current ($I_{cal}$), the meter (100, 100') is permanently calibrated at step 821. Otherwise it is determined if the meter (100, 100') is in time alignment at step 803 in a subsequent iteration of the calibration process 800 of FIG. 8.

The calibration process 800 provides calibration during times where calibration will not be affected by sun loading and temperature gradients by normal bus bar heating of the electrical connection 101. The calibration process can also result in issuing a high temperature alarm message when the calibration results in offsets greater than plus or minus 30° C.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A method of monitoring and controlling an operation of a meter electrically connected between a power source and a load, comprising:

periodically detecting a first temperature of a first location with a first sensor and detecting a second temperature of a second location with a second sensor;

processing the first temperature and the second temperature;

comparing at least one of the first temperature and the second temperature to a first threshold for transmitting an alarm and a second threshold for operating a remote disconnect switch to disconnect an electrical connection of the power source;

comparing the first temperature and the second temperature to determine a first temperature difference;

determining a short-term temperature average of at least one of the first temperature and the second temperature over a first number of samples;

determining a long-term temperature average of the at least one of the first temperature and the second temperature over a second number of samples;

determining an average rate of change based on the short-term temperature average and the long-term temperature average; and modifying at least one of the first threshold and the second threshold when it is determined the first temperature difference is equal to or greater than a third threshold and the average rate of change is equal to or greater than a fourth threshold.

2. The method according to claim 1, further comprising transmitting at least one alarm message when one of the first temperature and the second temperature is equal to or greater than first threshold corresponding to a first high temperature.

3. The method according to claim 2, further comprising operating the disconnect switch to disconnect the load from the power source and sending at least one second alarm message when one of the first temperature and the second temperature is equal to or greater than the second threshold corresponding to second high temperature.

4. The method according to claim 1, wherein the second number of samples is greater than the first number of samples.

5. The method according to claim 4, wherein the first number of samples includes a most recent first temperature at the first location and a predetermined number of samples of the first temperature detected immediately before detecting the most recent first temperature.

6. The method according to claim 4, wherein the second number of samples occur before a first sample of the first number of samples.

7. The method according to claim 6, wherein the second number of samples of the long-term temperature average includes each sample of the first temperature over a predetermined period of time before detecting the first sample of the first number of samples.

8. The method of claim 1, wherein determining the average rate of change further comprises determining a difference between the short-term temperature average and the long-term temperature average over a change in time.

9. The method according to claim 1, wherein modifying at least one of the first threshold and the second threshold comprises reducing the first threshold and the second threshold, and the first threshold is reduced by a first amount and the second threshold is reduced by a second amount when the average rate of change is greater than the fourth threshold for an average rate of temperature change by a first deviation.

10. The method according to claim 9, wherein the first threshold is reduced by a third amount different from the first amount and the second threshold is reduced by a fourth amount different from the second amount when the average rate of change is greater than the fourth threshold for an average rate of temperature by a second deviation.

11. The method according to claim 1, further comprising:
periodically determining a second temperature difference with the micro processor between one of the first temperature and at least one additional temperature detected at an additional location in the meter, and modifying at least one of the first threshold and the second threshold when the second temperature difference is equal to or greater than the third threshold and the average rate of change is equal to or greater than the fourth threshold.

12. The method according to claim 1, wherein the first location is adjacent to an electrical connection and the first temperature difference is determined when the first temperature is greater than the second temperature of the second location.

13. The method according to claim 4, further comprising:
restoring one of the first threshold and the second threshold to a respective original first threshold and an original second threshold after one of the first threshold and the second threshold has been modified and the first temperature is less than the second temperature at the second location.

14. The method according to claim 1, further comprising:
comparing the other of the at least one of the first temperature and the second temperature to a fifth threshold for transmitting an alarm and a sixth threshold for operating the remote disconnect switch; and determining a second short-term temperature average of the other of the at least one of the first temperature and the second temperature over a third number of samples;

determining a second long-term temperature average of the other of the at least one of the first temperature and the second temperature over a fourth number of samples;

determining a second average rate of change based on the second short-term temperature average and the second long-term temperature average; and modifying at least one of the fifth threshold and the sixth threshold when the first temperature difference is equal to or greater than third threshold and the second average rate of change is equal to or greater than the forth threshold.

15. An apparatus electrically connected between a power source and a load, comprising:
a first circuit and a second circuit;
a remote disconnect switch;
a plurality of temperature sensors, wherein a first sensor is proximate to the first circuit and detects a first temperature near the first circuit and a second sensor is proximate to the second circuit and detects a second temperature near the second circuit;

at least one processor configured to,
receive the first temperature from the first sensor and the second temperature from the second sensor,
compare at least one of the first temperature and the second temperature to a first threshold,
operate a remote disconnect switch when the at least one of the first temperature and the second temperature exceeds the first threshold,
determine an average rate of change based on a short-term temperature average of at least one of the first temperature and the second temperature over a first number of samples and a long-term temperature average of the at least one of the first temperature and the second temperature over a second number of samples, and modify the first threshold when a difference between the first temperature and second temperature is greater than a second threshold and the average rate of change exceeds a third threshold.

16. The apparatus according to claim 15, wherein the first circuit is proximate to an electrical connection and the processor is configured to determine the difference between the first temperature and second temperature when the first temperature is greater than the second temperature.

17. The apparatus according to claim 15, wherein the second number of samples is greater than the first number of samples.

18. The apparatus according to claim 17, wherein the first number of samples includes a most recent first temperature at the first location and a predetermined number of samples of the first temperature detected immediately before detecting the most recent first temperature.

19. The apparatus according to claim 17, wherein the second number of samples occur before a first sample of the first number of samples.

20. The apparatus according to claim 19, wherein the second number of samples of the long-term temperature average includes each sample of the first temperature over a predetermined period of time before the first sample of the first number of samples.

21. The apparatus according to claim 15, wherein
the remote disconnect switch connects an electrical connection between the power source to the load when set to a closed state and disconnects the electrical connection when set to an open state, wherein
the first threshold corresponds to a high temperature condition in the apparatus,
the first circuit is in the vicinity of the electrical connection, and
the processor is configured to set the remote disconnect switch to the open state when the first temperature is equal to or greater than the first threshold.

22. The apparatus according to claim 15, wherein the processor is configured to,
compare the other of the at least one of the first temperature and the second temperature to a fourth threshold,
operate the remote disconnect switch when the other of the at least one of the first temperature and the second temperature exceeds the fourth threshold,
determine a second short-term temperature average of the other of the at least one of the first temperature and the second temperature over a third number of samples,
determine a second long-term temperature average of the other of the at least one of the first temperature and the second temperature over a fourth number of samples,
determine a second average rate of change based on the second short-term temperature average and the second long-term temperature average, and
modify the fourth threshold when the difference between the first temperature and second temperature is greater than the second threshold and the second average rate of change exceeds the third threshold.

23. A non-transitory computer-readable storage medium storing executable instructions, which when executed by one or more processors, causes the one or more processors to perform:
periodically detecting a first temperature of a first location and detecting a second temperature of a second location;
comparing at least one of the first temperature and the second temperature to a first threshold for transmitting an alarm and a second threshold greater than the first threshold for operating a remote disconnect switch;
comparing the first temperature and the second temperature to determine a first temperature difference;
determining a short-term temperature average of at least one of the first temperature and the second temperature over a first number of samples;
determining a long-term temperature average of the at least one of the first temperature and the second temperature over a second number of samples;
determining an average rate of change based on the short-term temperature average and the long-term temperature average; and
modifying at least one of the first threshold and the second threshold when the first temperature difference is equal to or greater than a third threshold and the average rate of change is equal to or greater than a fourth threshold.

24. A meter electrically connected between a power source and a load, comprising:
a plurality of sensors including a first sensor that detects a first temperature of a first location in the meter and a second sensor that detects a second temperature of a second location in the meter;
at least one processor configured to,
receive the first temperature and the second temperature,
compare at least one threshold and at least one of the first temperature and the second temperature,
operate at least one of an alarm and a switch when the at least one of the first temperature and the second temperature exceeds the at least one threshold,
determine an average rate of change based on a short-term temperature average based on a first number of samples and a long-term temperature average based on a second number of samples of the at least one of the first temperature and the second temperature, and
reduce the at least one threshold when a difference between the first temperature and second temperature is greater than a first predetermined amount and the average rate of change exceeds a second predetermined amount.

25. The meter according to claim 24, wherein
the at least one threshold corresponds to a high temperature condition in the meter, and
the processor is configured to operate the alarm and transmits a high temperature alarm when the at least one of the first temperature and the second temperature exceeds the at least one threshold.

26. The meter according to claim 24, wherein
the at least one threshold corresponds to a disconnection temperature condition in the meter, and
the processor is configured to operate the switch to disconnect an electrical connection in the meter when the at least one of the first temperature and the second temperature exceeds the at least one threshold.

27. The meter according to claim 25, wherein
the processor compares a second threshold corresponding to a disconnection temperature condition in the meter and at least one of the first temperature and the second temperature, and
the processor operates the switch to disconnect an electrical connection in the meter when the at least one of the first temperature and the second temperature exceeds the second threshold.

28. A meter electrically connected between a power source and a load, comprising:
a first sensor that detects a first temperature of a first location in the meter;
at least one processor configured to,
receive the first temperature from the first sensor,
compare at least one threshold and the first temperature, operate at least one of an alarm and a switch when the first temperature exceeds the at least one threshold,
determine a first temperature average of the first temperature over a short-term number of samples,
determine a second temperature average of the first temperature over a long-term number of samples,
determine an average rate of change based on the first temperature average and the second temperature average, and
reduce the at least one threshold when the average rate of change exceeds a predetermined amount.

29. A method of monitoring and controlling an operation of a meter electrically connected between a power source and a load, comprising:
periodically detecting a first temperature of a first location with a first sensor;
transmitting the first temperature from the first sensor to a microprocessor;
comparing the first temperature to a first threshold for at least one of transmitting an alarm and operating a remote disconnect switch to disconnect an electrical connection of the power source;
determining a first temperature average of the first temperature over a short-term number of samples;
determining a second temperature average of the first temperature over a long-term number of samples;
determining an average rate of change based on the first temperature average and the second temperature average; and
modifying the first threshold when average rate of change is equal to or greater than a predetermined amount for an average rate of temperature change.

* * * * *